(12) United States Patent
Lee

(10) Patent No.: US 8,089,143 B2
(45) Date of Patent: *Jan. 3, 2012

(54) INTEGRATED CIRCUIT PACKAGE SYSTEM USING INTERPOSER

(75) Inventor: Myung Kil Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 1483 days.

This patent is subject to a terminal disclaimer.

(21) Appl. No.: 11/162,635

(22) Filed: Sep. 16, 2005

(65) Prior Publication Data

US 2006/0175695 A1 Aug. 10, 2006

Related U.S. Application Data

(60) Provisional application No. 60/652,218, filed on Feb. 10, 2005.

(51) Int. Cl.
*H01L 23/02* (2006.01)

(52) U.S. Cl. ........ 257/686; 257/687; 257/678; 257/787; 257/E23.004; 438/109; 438/106; 438/107; 438/110

(58) Field of Classification Search .................. 257/686, 257/687, 678, 787, E23.004; 438/109, 106, 438/107, 110
See application file for complete search history.

(56) References Cited

U.S. PATENT DOCUMENTS

| | | | |
|---|---|---|---|
| 5,331,591 A * | 7/1994 | Clifton | 365/182 |
| 5,723,903 A * | 3/1998 | Masuda et al. | 257/696 |
| 5,963,430 A * | 10/1999 | Londa | 361/790 |
| 6,650,006 B2 | 11/2003 | Huang et al. | 257/686 |
| 6,674,160 B1 * | 1/2004 | Taguchi | 257/686 |
| 6,861,288 B2 | 3/2005 | Shim et al. | 438/109 |
| 7,258,549 B2 * | 8/2007 | Asahi et al. | 439/66 |
| 7,800,212 B2 * | 9/2010 | Yoon et al. | 257/686 |
| 2004/0037059 A1 | 2/2004 | Stiborek et al. | 361/784 |
| 2004/0235287 A1* | 11/2004 | Inoue et al. | 438/612 |
| 2006/0065972 A1* | 3/2006 | Khan et al. | 257/712 |

* cited by examiner

*Primary Examiner* — Junghwa M Im
(74) *Attorney, Agent, or Firm* — Mikio Ishimaru

(57) ABSTRACT

An integrated circuit package system is provided in which an interposer of predetermined thickness including a central cavity is formed. Additionally, one or more contacts are formed around the central cavity on the interposer. The interposer is employed for connecting first and second packages.

20 Claims, 3 Drawing Sheets

INTEGRATED CIRCUIT PACKAGE SYSTEM USING INTERPOSER

CROSS-REFERENCE TO RELATED APPLICATION

This application claims the benefit of U.S. Provisional Patent Application Ser. No. 60/652,218 filed Feb. 10, 2005, and the subject matter thereof is hereby incorporated herein by reference thereto.

TECHNICAL FIELD

The present invention relates generally to integrated circuit packaging, and more particularly to a system for stacking integrated circuit packages.

BACKGROUND ART

Faster, more reliable, and higher-density circuits, produced at lower cost, are the goals for the entire integrated circuit (IC) packaging industry to produce smaller devices for cellphones, video cameras, portable music players, etc. The goals of packaging IC for the future will be met by reducing the number of internal interconnections and increasing the density of chips. Various techniques, such as, flip chip, gall grid array (BGA), chip on board (COB), and multi-chip modules (MCM), have been developed to meet the continued demands for improving system performance and hardware capabilities, while the space in which to provide these improved hardware capabilities continues to decrease.

Multiple integrated circuit devices may be fabricated within a single package, thereby forming a MCM. A single MCM may include two or more discrete integrated circuit devices, which may be arranged one on top of one another over a substrate (i.e.—vertically stacked). This mounting technique permits a higher density of chips or integrated circuits on the MCM substrate. The substrate may include one or more layers of electrically conductive material separated by dielectric materials.

Although vertically stacked MCM's may increase the effective density of chips, over that of horizontally placed MCM components, it has the disadvantage in that the MCM's must usually be assembled before the component chips and chip connections can be tested. These extra manufacturing steps can lead to increased cost and decreased product yield if the chips are defective.

Another common problem associated with vertically stacked MCM's is that the bottom chip must be larger than the top chip to accommodate the plurality of bond pads located on the bottom chip. Due to the constraint of limited space available for mounting individual chips on a substrate, the larger configuration of the bottom chip decreases the number of chips per semiconductor wafer, and correspondingly, increases the cost of manufacturing.

Another manufacturing technique is vertically stacked packaging (i.e.—a package on package configuration). However, this manufacturing process has its own problems, such as, local and global planarization inconsistencies. Additionally, the mold cap of a bottom package in a package on package structure must be kept thin; otherwise, the ball diameters of the solder balls formed on the top substrate must be excessively large in order to contact the bottom package. However, thin mold caps can cause their own problems during package on package assembly, such as, restricted selection of epoxy mold compounds.

Thus, despite recent developments in semiconductor packaging techniques, a need still remains for improved packaging device structures and methods of fabrication for increasing semiconductor chip densities to increase efficient use of wafer space.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system in which an interposer of predetermined thickness including a central cavity is formed. Additionally, one or more contacts are formed around the central cavity on the interposer. The interposer is employed for connecting first and second packages.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
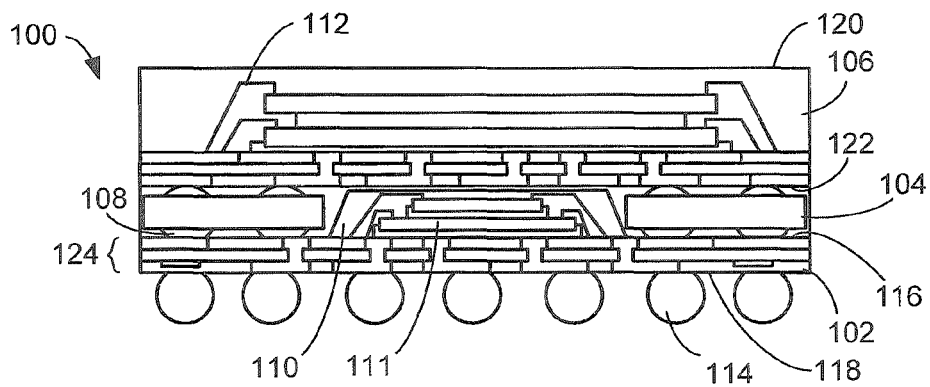
FIG. 1 is a cross sectional view of a package on package structure in accordance with an embodiment of the present invention.

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGS. In addition, where multiple embodiments are disclosed and described having some features in common, for clarity and ease of illustration, description, and comprehension thereof, similar and like features one to another will ordinarily be described with like reference numerals.

The following embodiments are described in sufficient detail to enable those skilled in the art to make and use the invention, and it is to be understood that other embodiments would be evident based on the present disclosure and that process or mechanical changes may be made without departing from the scope of the present invention.

The term "horizontal" as used herein is defined as a plane parallel to the plane or surface of the bottom package substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "lower", and "under", are defined with respect to the horizontal plane.

Referring now to FIG. 1, therein is shown a cross sectional view of a package on package system 100 in accordance with an embodiment of the present invention. By way of example, and not intended to limit the scope of applicable components, the package on package system 100 may be comprised by active components and/or passive components.

The package on package system 100, of FIG. 1, illustrates a final assembled structure. A bottom package 102 has a top surface 116 and a bottom surface 118. A top package 106 has a top surface 120 and a bottom surface 122. The top surface 116 of the bottom package 102 is separated from the bottom surface 122 of the top package 106 by an interposer 104.

The interposer 104 possesses contacts 108, on opposing sides, to provide electrical interconnections between the bottom package 102 and the top package 106. Additionally, the bottom surface 118 of the bottom package 102 comprises a plurality of solder balls 114 that provide electrical connection to an external substrate such as, for example, a printed circuit board ("PCB", not shown). Wirebonds 112 provide additional electrical connection to the top package 106.

The top surface 116 of the bottom package 102 has formed thereon a mold portion 110. Located within the mold portion 110, by way of example and not intended to limit, could be an integrated circuit ("IC") chip. The interposer 104 is formed of a predetermined thickness so as to accommodate the height of the mold portion 110 and to additionally provide connection between the bottom package 102 and the top package 106. The interposer 104 is normally the same size as a bottom substrate 124. Previous package on package designs were limited by mold portion thickness because as the mold portion grew thicker the solder ball diameter of the top package grew prohibitively large. Therefore, mold portions were kept thin to prevent excessively large solder ball diameters from affecting the manufacturing process. Unfortunately, excessively thin mold portions are subject to manufacturing problems such as limiting the selection of epoxy mold compounds.

Figure 2:
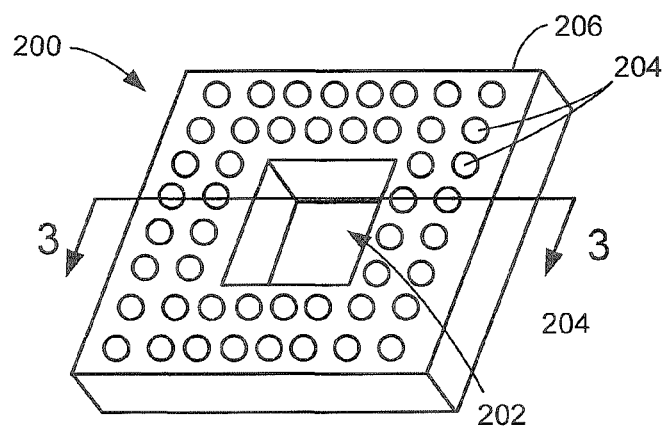
FIG. 2 is an isometric view of an interposer in accordance with an embodiment of the present invention.

Referring now to FIG. 2, there is shown a view of an interposer 200 in accordance with an embodiment of the present invention. The interposer 200 is depicted as square in shape but may be any shape necessary to match the packaging structure or the underlying substrate. Located within a perimeter 206 of the interposer 200 is a central cavity 202. The central cavity 202 is a void space formed within the interposer 200. The dimensions of the central cavity 202 are normally large enough to contain the mold portion 110 of the bottom package 102, as depicted in FIG. 1. However, the dimensions of the central cavity 202 can be increased or decreased to suit the required manufacturing design needs.

Contacts 204 are formed around the central cavity in the area between the perimeter 206 and the central cavity 202. The contacts 204 provide electrical interconnection between the bottom package 102 and the top package 106 and can be comprised by, for example, and not by way of limitation, a solder ball array such as a ball grid array ("BGA").

Figure 3:
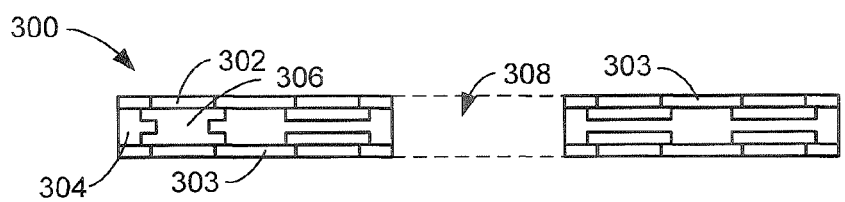
FIG. 3 is a cross sectional view of the structure of FIG. 2 taken on line 3-3 in accordance with an embodiment of the present invention.

Referring now to FIG. 3, therein is shown a cross sectional view of the structure of FIG. 2 taken on line 3-3 in accordance with an embodiment of the present invention. An interposer 300 has a central cavity 308 and possesses contact pads 302, which by way of example, and not by way of limitation, may be comprised by nickel/gold plating, formed in a solder resist 303 on a substrate 304. The contact pads 302 provide an interface between the bottom package 102 and/or the top package 106 of FIG. 1 using interconnects 306 through a substrate 304. The interconnects 306 include copper filled vias or copper plated through holes.

Figure 4:
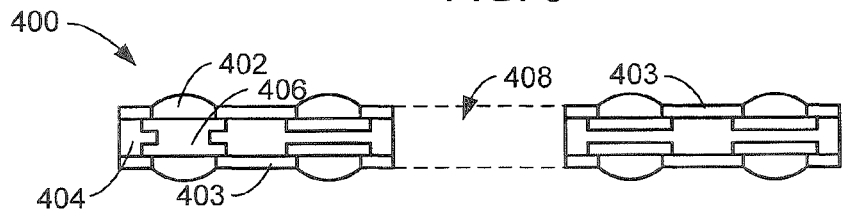
FIG. 4 is a cross sectional view of the structure of FIG. 3 in accordance with another embodiment of the present invention.

Referring now to FIG. 4, therein is shown a cross sectional view of the structure of FIG. 3 in accordance with another embodiment of the present invention. An interposer 400 has an internal cavity 408 and employs solder on pad ("SOP") or organic solderability preservative ("OSP") forming ball pads 402 in a solder resist 403. In at least one embodiment, the ball pads 402 and the solder resist 403 can be formed on opposing sides of the interposer 400. The ball pads 402 provide an interface between the bottom package 102 and/or the top package 106 of FIG. 1 using interconnects 406 through a substrate 404. The interconnects 406 include copper filled vias or copper plated through holes.

Figure 5:
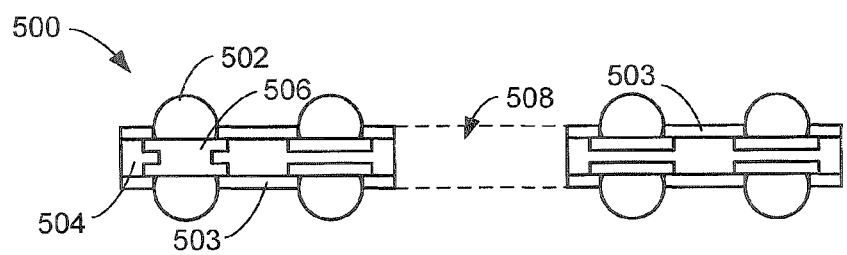
FIG. 5 is a cross sectional view of the structure of FIG. 4 in accordance with a further embodiment of the present invention.

Referring now to FIG. 5, there is shown a cross sectional view of the structure of FIG. 4 in accordance with a further embodiment of the present invention. An interposer 500 has an central cavity 508 and employs ball-to-ball stacks. Solder balls 502 in a solder resist 503 provide an interface between the bottom package 102 and/or the top package 106 of FIG. 1 using interconnects 506 through a substrate 504. The interconnects 506 include copper filled vias or copper plated through holes.

FIGS. 6-10 provide by way of example, five steps in the production of a package on package structure. The steps need not be performed in the order presented and can be performed in any manner suitable to facilitate production.

Figure 6:
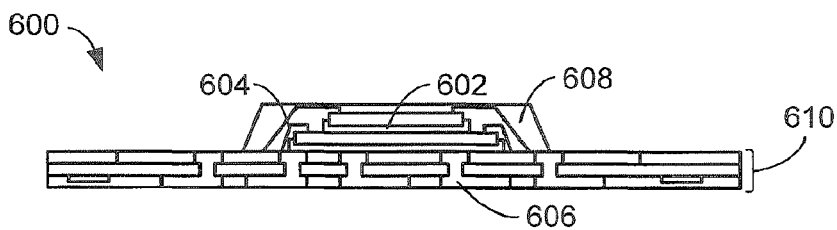
FIG. 6 is a cross sectional view of a bottom package in accordance with an embodiment of the present invention.

Referring now to FIG. 6, therein is shown a cross sectional view of a bottom package 600 in accordance with an embodiment of the present invention. The bottom package 600 includes an integrated circuit 602, wirebonding 604, an interconnect 606, an encapsulation material 608, and a substrate 610. The integrated circuit 602 can be attached to the substrate 610 by any adhesive or thermally conductive adhesive conventionally used for this purpose. The wirebonding 604 provides electrical connection between the integrated circuit 602 and the substrate 610. The interconnects 606 provide electrical connection to an external substrate such as, by way of example, a printed circuit board ("PCB", not shown). The encapsulation material 608 protects the integrated circuit 602 from external elements and correspondingly comprises the mold portion of the bottom package 600.

Figure 7:
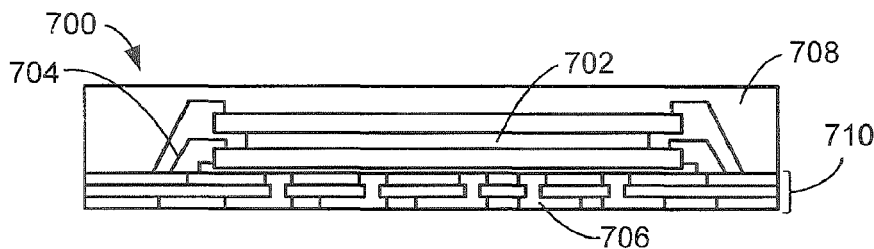
FIG. 7 is a cross sectional view of a top package in accordance with an embodiment of the present invention.

Referring now to FIG. 7, therein is shown a cross sectional view of a top package 700 in accordance with an embodiment of the present invention. The top package 700 includes an integrated circuit 702, wirebonding 704, an interconnect 706, an encapsulation material 708, and a substrate 710. The integrated circuit 702 can be attached to the substrate 710 by any adhesive or thermally conductive adhesive conventionally used for this purpose. The wirebonding 704 provides electrical connection between the integrated circuit 702 and the substrate 710. The interconnects 706 provide electrical connection to an external substrate such as, by way of example, a printed circuit board ("PCB", not shown). The encapsulation material 708 protects the integrated circuit 702 from external elements.

Figure 8:
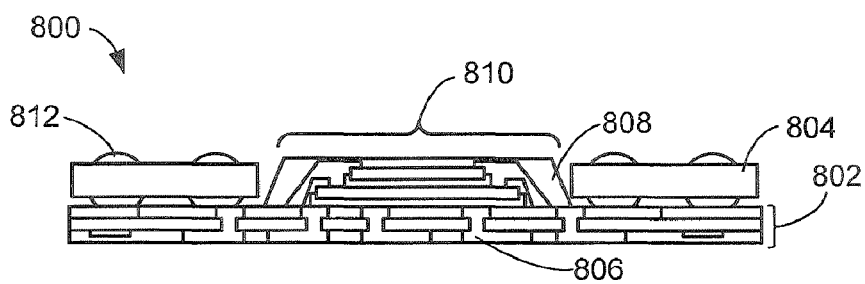
FIG. 8 is a cross sectional view of an assembly of an interposer attached to a bottom package in accordance with an embodiment of the present invention.

Referring now to FIG. 8, therein is shown a cross sectional view of an assembly 800 of an interposer attached to a bottom package in accordance with an embodiment of the present invention. An interposer 804 is formed over a substrate 802 and horizontally adjacent to a mold portion 810. Contacts 812 electrically interconnect the interposer 804 and the substrate 802.

As previously discussed in FIGS. 3-5, the contacts 812 may be comprised by materials such as, by way of example, nickel/gold plating over pads, solder on pads, organic solderability preservatives, or a ball to ball stack. Additionally, the contacts 812 on the bottom surface of the interposer 804 interface with interconnects 806, and are correspondingly connected to an external substrate such as a PCB. The mold portion 810 is defined by an encapsulation material 808 and the mold portion 810 is smaller than the substrate 802.

Figure 9:
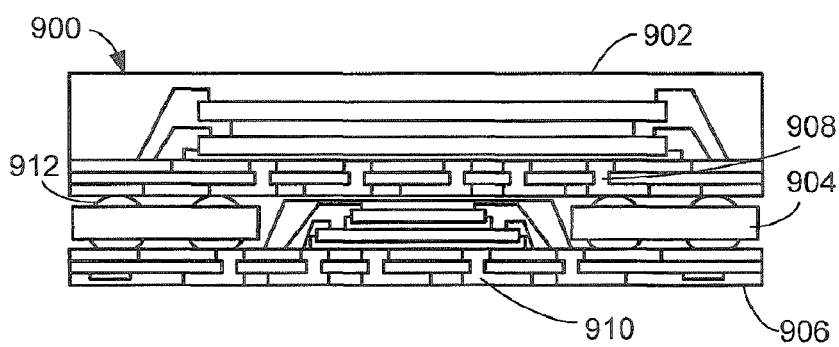
FIG. 9 is a cross sectional view of a package on package stack in accordance with an embodiment of the present invention.

Referring now to FIG. 9, therein is shown a cross sectional view of a package on package stack 900 in accordance with an embodiment of the present invention. The package on package stack 900 includes a top package 902, an interposer 904 and a bottom package 906. After the interposer 904 is formed over the bottom package 906, the top package 902 is formed over the interposer 904. Although FIG. 9 merely shows a single package on package structure 900, multiple package on package structures could be vertically stacked by placing an interposer between each package.

As previously discussed in FIGS. 3-5, contacts 912 may be comprised by materials such as, by way of example, nickel/gold plating over pads, solder on pads, organic solderability preservatives, or a ball to ball stack. Additionally, the contacts 912 on the top surface of the interposer 904 interface with the interconnects 908 and provide electrical contact between the top package 902 and the bottom package 906. Finally, the contacts 912 on the bottom surface of the interposer 904 interface with the interconnects 910.

Singulation and external visual inspection are then performed at this point.

Figure 10:
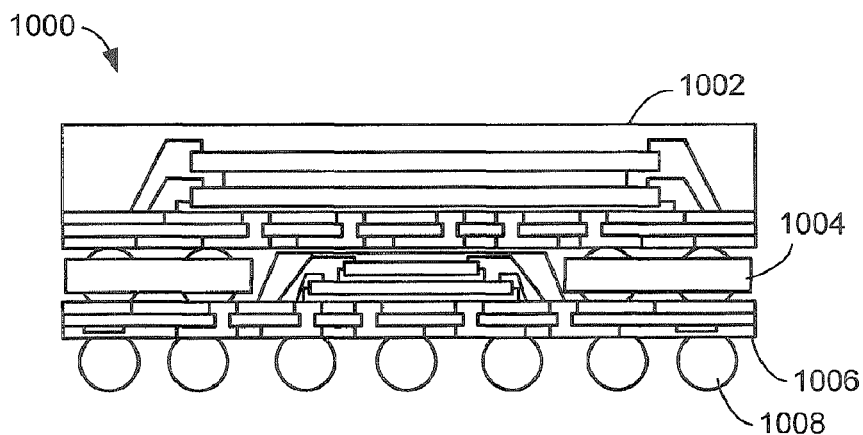
FIG. 10 is a cross sectional view of a final package assembly in accordance with an embodiment of the present invention.

Referring now to FIG. 10, therein is shown a cross sectional view of a package on package system 1000 in accordance with an embodiment of the present invention. The package on package system 1000 includes a top package 1002, an interposer 1004, a bottom package 1006 and solder balls 1008. After the top package 1002 is formed over the interposer 1004, the package on package system 1000 is provided with solder ball mounts ("SBM") 1008.

Figure 10A:
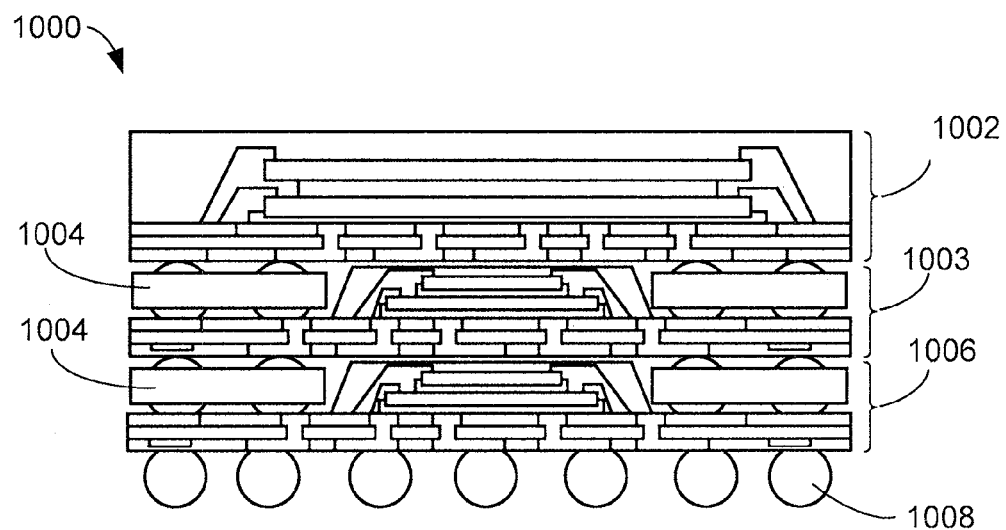
FIG. 10A is a cross sectional view of a package assembly in accordance with another embodiment of the present invention.

Referring now to FIG. 10A, therein is shown a cross sectional view of the package on package system 1000 in accordance with another embodiment of the present invention. The package on package system 1000 may include a top package 1002, an intermediate package 1003, an interposer 1004, a bottom package 1006, and solder balls 1008. It will be appreciated by those skilled in the art that multiple package structures can be vertically stacked by placing the interposer 1004 between each package. After the top package 1002 is formed over the interposer 1004 of the intermediate package 1003, the package on package system 1000 is provided with solder ball mounts ("SBM") 1008.

Figures 11, 12:
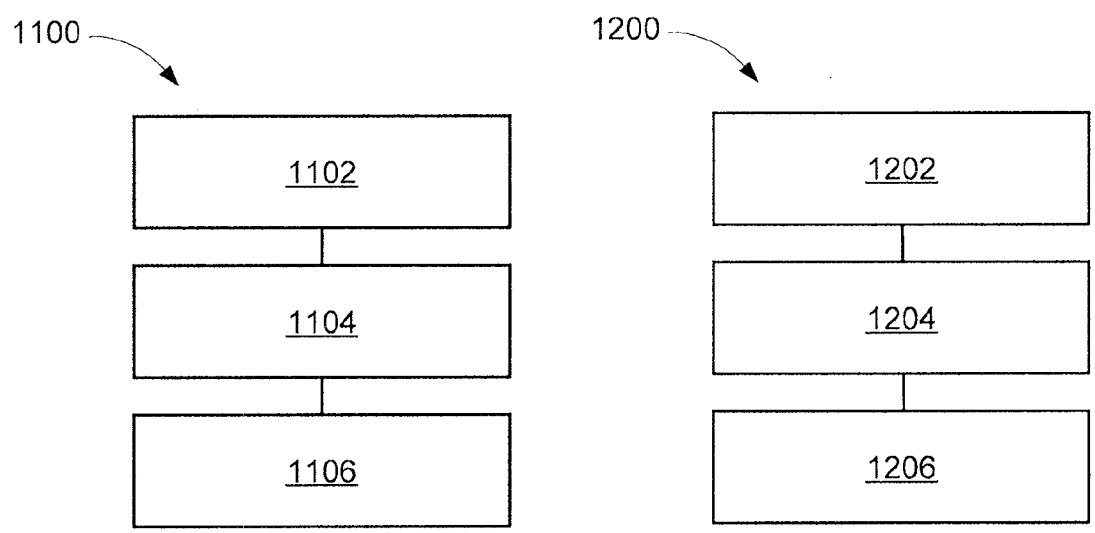
FIG. 11 is a flow chart for fabricating an integrated circuit package system in accordance with an embodiment of the present invention.
FIG. 12 is a flow chart for fabricating an integrated circuit system interposer formed over a bottom package with a top package formed over the interposer in accordance with an embodiment of the present invention.

Referring now to FIG. 11, therein is shown a flow chart for an integrated circuit package system 1100 in accordance with an additional embodiment of the present invention. The system 1100 includes providing an interposer of predetermined thickness including a central cavity in a block 1102; forming one or more contacts around the central cavity on the interposer in a block 1104; and employing the interposer for connecting a first and second package in a block 1106.

Referring now to FIG. 12, therein is shown a flow chart for an integrated circuit package system 1200 in accordance with a further additional embodiment of the present invention. The system 1200 includes forming a bottom package with a mold portion in a block 1202; forming an interposer over the bottom package with a central cavity and one or more electrical interconnections for electrically interconnecting the bottom package and a top package in a block 1204; and forming the top package over the interposer in a block 1206.

It has been discovered that the present invention has numerous advantages. One such advantage is that the present invention can use wirebonding as opposed to reverse bonding or forward bonding. The use of wirebonding leads to reduced manufacturing time and a corresponding increase in productivity.

Another advantage of the present invention is that the use of an interposer with a central cavity allows for various chip thickness and chip stacking configurations for the bottom package. The present inventions interposer allows configurations that were previously unobtainable due to limitations on the mold portions thickness. The present inventions interposer helps to eliminate concerns about local planarizations, as well as, eliminate concerns about solder ball diameter of the top package.

Another advantage of the present invention is that the use of an interposer with a central cavity allows for various chip thickness and chip stacking configurations for the bottom package. The present inventions interposer allows configurations that were previously unobtainable due to limitations on the mold portions thickness. The present inventions interposer helps to eliminate concerns about local planarizations, as well as, eliminate concerns about solder ball diameter of the top package.

Yet another advantage of the present invention is decreased solder ball diameter and increased solder ball density of the top package. Since the contacts formed on the interposer reduce the void space between the bottom and top packages, the solder balls formed on the top package can be made smaller. Consequently, a greater density of solder balls can be formed on the top package, and this leads to a greater number of contact points that can interconnect the interposer and top package.

Yet still another advantage of the present invention is the increased selection of epoxy mold compounds ("EMC"). Due to the increase in allowable thickness of the mold portion, previously restricted EMCs can now be used. For instance, both normal and fine filler size EMCs are usable.

Thus, it has been discovered that the integrated circuit system method and apparatus of the present invention furnish important and heretofore unknown and unavailable solutions, capabilities, and functional advantages. For instance, wirebonding can now be efficiently employed, various chip thickness and chip stacking configurations are now allowable for bottom packages, increased contact density can be had on a top package, and a wider selection of EMCs can be used. The resulting processes and configurations are straightforward, cost-effective, uncomplicated, highly versatile and effective, can be implemented by adapting known technologies, and are thus readily suited for efficient and economical manufacturing.

The present invention also provides an integrated circuit system fabrication technique in which a bottom package with a mold portion is formed. An interposer is formed over the bottom package with a central cavity and one or more electrical interconnections that electrically interconnects the bottom package and a top package. A top package is then formed over the interposer.

The present invention also provides an integrated circuit system in which an interposer, with a central cavity and of predetermined thickness, is connected to a package with a mold portion. The interposer includes one or more contacts formed around the central cavity.

The present invention also provides an integrated circuit system in which a bottom package with a mold portion is provided. Additionally, a top package is provided. An interposer with a central cavity is provided between the bottom package and a top package. The interposer electrically interconnects the bottom package and top package by one or more contacts formed around the central cavity.

The present invention also provides interposers allowing various chip thickness configurations, chip stacking configurations, or multiple vertical packages by stacking an interposer between each package.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    forming an interposer of predetermined thickness to include a central cavity;
    forming one or more contacts around the central cavity on the interposer, the contacts including solder balls in a solder resist on opposing sides of the interposer; and
    employing the interposer for connecting a top and a bottom package.

2. The method of claim 1 further comprising: forming the interposer substantially the same size as a bottom substrate of the bottom package; and forming the central cavity large enough to contain a mold portion of the bottom package.

3. The method of claim 1 further comprising:
    forming the interposer to allow for various chip thickness configurations, chip stacking configurations, or multiple vertical packages by stacking the interposer between each package.

4. The method of claim 1 further comprising:
    forming an epoxy mold compound selected from the group consisting of normal and fine filler sizes around an integrated circuit chip.

5. The method of claim 1 further comprising:
    forming electrical connections between one or more pads on an integrated circuit and one or more terminals on a substrate by wirebonding.

6. A method of manufacture of an integrated circuit package system comprising:
    forming a bottom package with a mold portion;
    forming an interposer over the bottom package with a central cavity and one or more contacts for electrically interconnecting the bottom package and a top package through the interposer, the contacts including solder balls in a solder resist on opposing sides of the interposer; and
    forming the top package over the interposer.

7. The method of claim 6 further comprising: forming the interposer substantially the same size as the bottom package; and forming the central cavity large enough to contain the mold portion of the bottom package.

8. The method of claim 6 further comprising:
    forming the interposer to allow for various chip thickness configurations, chip stacking configurations, or multiple vertical packages by stacking the interposer between each package.

9. The method of claim 6 further comprising:
    forming one or more of the contacts to include organic solderability preservatives or solder on pad.

10. The method of claim 6 further comprising:
    forming electrical connections between one or more pads and one or more terminals by wirebonding.

11. An integrated circuit package system comprising:
    an interposer with a central cavity and predetermined thickness for connecting a bottom and a top package; and
    one or more contacts formed around the cavity, the contacts including solder balls in a solder resist on opposing sides of the interposer.

12. The system of claim 11 further comprising: the bottom package having a bottom substrate and a mold portion; and wherein: the interposer is substantially the same size as the bottom substrate; and the central cavity is large enough to contain the mold portion of the bottom package.

13. The system of claim 11 further comprising:
    two or more of the interposer to provide various chip thickness configurations, chip stacking configurations, or multiple vertical stacked package configurations.

14. The system of claim 11 further comprising:
    one or more epoxy mold compounds selected from the group consisting of normal and fine filler sizes on at least one side of the interposer.

15. The system of claim 11 further comprising:
    electrical connections wirebonded between one or more pads on an integrated circuit and one or more terminals on a substrate.

16. An integrated circuit package system comprising:
    a bottom package with a mold portion;
    a top package; and
    an interposer with a central cavity between the bottom package and the top package, the interposer electrically interconnecting the bottom package and the top package by one or more contacts around the central cavity and connected through the interposer, the contacts including solder balls in a solder resist on opposing sides of the interposer.

17. The system of claim 16 wherein: the interposer is substantially the same size as a bottom substrate; and the central cavity is large enough to contain the mold portion of the bottom substrate.

18. The system of claim 16 further comprising:
    a plurality of packages; and
    a plurality of the interposer for providing various chip thickness configurations, chip stacking configurations, or multiple vertical packages by stacking the interposer between each of the plurality of packages.

19. The system of claim 16 further comprising:
    one or more epoxy mold compounds selected from the group consisting of normal and fine filler sizes on the interposer.

20. The system of claim 16 wherein:
    the one or more contacts on the interposer include organic solderability preservatives or solder on pad.

* * * * *

UNITED STATES PATENT AND TRADEMARK OFFICE
CERTIFICATE OF CORRECTION

PATENT NO.       : 8,089,143 B2                                              Page 1 of 2
APPLICATION NO.  : 11/162635
DATED            : January 3, 2012
INVENTOR(S)      : Lee It is certified that error appears in the above-identified patent and that said Letters Patent is hereby corrected as shown below:

Column 3:
lines 25-26, delete "(as in "sidewall"), "higher", "lower", "upper", "lower", and "under", are
   defined" and insert therefor --(as in "sidewall"), "higher", "lower", "upper", "over", and
   "under", are defined--

Column 4:
line 44, delete "FIGS. 6-10 provide" and insert therefor --Figures 6-10 provide--

Column 5:
line 16, delete "in FIGS. 3-5, the contacts" and insert therefor --in Figures 3-5, the contacts--

Column 6:
lines 19-35, the following [Para 48] from the specification was repeated. Please delete:

"Another advantage of the present invention is that the use of an interposer with a central cavity allows for various chip thickness and chip stacking configurations for the bottom package. The present inventions interposer allows configurations that were previously unobtainable due to limitations on the mold portions thickness. The present inventions interposer helps to eliminate concerns about local planarizations, as well as, eliminate concerns about solder ball diameter of the top package.

Another advantage of the present invention is that the use of an interposer with a central cavity allows for various chip thickness and chip stacking configurations for the bottom package. The present inventions interposer allows configurations that were previously unobtainable due to limitations on the mold portions thickness. The present inventions interposer helps to eliminate concerns about local planarizations, as well as, eliminate concerns about solder ball diameter of the top package."

and insert therefor
   --Another advantage of the present invention is that the use of an interposer with a central Signed and Sealed this
Third Day of July, 2012

David J. Kappos
*Director of the United States Patent and Trademark Office* cavity allows for various chip thickness and chip stacking configurations for the bottom package. The present inventions interposer allows configurations that were previously unobtainable due to limitations on the mold portions thickness. The present inventions interposer helps to eliminate concerns about local planarizations, as well as, eliminate concerns about solder ball diameter of the top package.--